(12) United States Patent
Pichai et al.

(10) Patent No.: US 10,306,810 B1
(45) Date of Patent: May 28, 2019

(54) HOT-AISLE COOLING

(71) Applicant: Equinix, Inc., Redwood City, CA (US)

(72) Inventors: Tikhon Suresh Pichai, Simpsonville, SC (US); Douglas James Asay, San Jose, CA (US)

(73) Assignee: EQUINIX, INC., Redwood City, CA (US)

( * ) Notice: Subject to any disclaimer, the term of this patent is extended or adjusted under 35 U.S.C. 154(b) by 156 days.

(21) Appl. No.: 15/348,951

(22) Filed: Nov. 10, 2016

(51) Int. Cl.
*H05K 7/20* (2006.01)
*F24F 13/08* (2006.01)

(52) U.S. Cl.
CPC ......... *H05K 7/20745* (2013.01); *F24F 13/08* (2013.01); *H05K 7/20709* (2013.01)

(58) Field of Classification Search
CPC combination set(s) only.
See application file for complete search history.

(56) References Cited

U.S. PATENT DOCUMENTS

| | | | | |
|---|---|---|---|---|
| 3,230,556 | A * | 1/1966 | Shippee | A47C 21/044 |
| | | | | 392/379 |
| 8,348,732 | B2 * | 1/2013 | Aronstam | F24F 3/00 |
| | | | | 236/49.1 |
| 2008/0185446 | A1 | 8/2008 | Tozer | |
| 2010/0304657 | A1 * | 12/2010 | Gallmann | G06F 1/20 |
| | | | | 454/184 |
| 2015/0208553 | A1 * | 7/2015 | Bauchot | H05K 7/20745 |
| | | | | 361/679.47 |
| 2015/0305208 | A1 * | 10/2015 | Rogers | H05K 7/20745 |
| | | | | 165/80.3 |
| 2016/0363330 | A1 * | 12/2016 | Kim | F24F 1/025 |

OTHER PUBLICATIONS

Cottuli, Cart, "Selecting the Right Airflow Containment Solution", Data Center Knowledge, Penton, Mar. 24, 2011, available at http://www.datacenterknowledge.com/archives/2011/03/24/why-use-containment-in-the-data-center/ (accessed Nov, 10, 2016), 5 pgs.
Niemann et al. "Impact of Hot and Cold Aisle Containment on Data Center Temperature and Efficiency" White Paper 135, Revision 2, Schneider Electric, 2011 (Applicant points out, in accordance with MPEP 609.04(a), that the year of publication, 2011, is sufficiently earlier than the effective U.S. filing date, so that the particular month of publication is not in issue), 14 pgs.

* cited by examiner

*Primary Examiner* — Gregory L Huson
*Assistant Examiner* — Elizabeth M. May
(74) *Attorney, Agent, or Firm* — Shumaker & Sieffert, P.A.

(57) ABSTRACT

In some examples, a system includes a data center storage space, a partition, and a cooling device. The data center storage space includes a hot aisle and a cold aisle. The partition separates the hot aisle and the cold aisle and defines an aperture. The cooling device includes a connection member and a flexible member. The connection member is configured to connect to the aperture and defines a first lumen. The flexible member is connected to the connection member and defines a second lumen. At least a portion of the flexible member is configured to be selectively movable. The cooling device is configured to allow cool air to move from the cold aisle to the hot aisle to lower a temperature of air disposed within the hot aisle.

20 Claims, 4 Drawing Sheets

HOT-AISLE COOLING

TECHNICAL FIELD

The disclosure relates to facility management, and more specifically, to managing air temperatures within a data center facility.

BACKGROUND

A facility such as a data center includes a data center storage space and work space containing numerous electronic devices that produce heat, including network, server, and storage gear, as well as power distribution units for distributing power to devices within the facility. A cooling unit may be used to supply a cool air stream into the storage volume. Warm exhaust produced by electronic devices within the storage volume may be returned to the cooling unit as return air for cooling and recirculation within or outside the storage volume. This return, cooling, and recirculation of air within the the facility may help to keep the air within the storage volume cool to maintain safety, performance, and reliability of the electronic devices within the storage volume.

SUMMARY

In general, techniques of the disclosure are directed to a cooling device configured to selectively release cool air from a cold aisle to a hot aisle in a data center. The cooling device may be configured to connect to the cold aisle space, including by means of an aperture in a partition between the hot aisle and the cold aisle. The cooling device may include a connection member for connecting to the aperture, a flexible member that may be selectively positioned to direct cool air into a desired area within the hot aisle such as the space where a person is working in the hot aisle, and an optional fan for directing the air though the device from the cold aisle to the hot aisle. The device or the partition may further include a valve to limit or prohibit air flow through the device at some times and allow air flow through the device at others. The device may further include one or more actuators to open or close the valve and/or turn on or off the fan. In some examples, the device may further include a timer configured to automatically turn off the fan and/or close the valve after a predetermined time period following actuation of the fan and/or the valve such that the device is not accidentally left directing or allowing air from the cold aisle to the hot aisle when no longer needed.

In one example, a system includes a data center storage space, a partition, and a cooling device. The data center storage space includes a hot aisle and a cold aisle. The partition separates the hot aisle and the cold aisle and defines an aperture. The cooling device includes a connection member and a flexible member. The connection member is configured to connect to the aperture and defines a first lumen. The flexible member is connected to the connection member and defines a second lumen. At least a portion of the flexible member is configured to be selectively movable. The cooling device is configured to allow cool air to move from the cold aisle to the hot aisle to lower a temperature of air disposed within the hot aisle.

In another example, an assembly includes a partition and a cooling device. The partition is configured for placement between a hot aisle and a cold aisle of a data center and defines an aperture. The cooling device includes a connection member and a flexible member. The connection member is configured to connect to the aperture and defines a first lumen. The flexible member is connected to the connection member and defines a second lumen. At least a portion of the flexible member is configured to be selectively movable.

In another example, a cooling device includes a connection member, a flexible member, and a fan. The connection member is configured to connect to an aperture defined by a partition between a hot aisle and a cold aisle of a data center and the connection member defines a first lumen. The flexible member is connected to the connection member and defines a second lumen. At least a portion of the flexible member is configured to be selectively movable. The fan is configured to move cool air from the cold aisle to the hot aisle to lower a temperature of air disposed within the hot aisle. At least a portion of the fan is positioned within the first lumen or the second lumen.

The details of one or more examples are set forth in the accompanying drawings and the description below. Other features, objects, and advantages of the disclosure will be apparent from the description and drawings, and from the claims.

BRIEF DESCRIPTION OF DRAWINGS

Like reference characters denote like elements throughout the figures and text.

DETAILED DESCRIPTION

A co-location facility may contain numerous electronic devices that produce heat, including the network, server, and storage gear, as well as power distribution units (PDUs) for distributing power to devices within the facility.

A co-location facility data center may employ a cooling air supply system for cooling electronic devices within the data center. Servers and other equipment may pull cool air from streams of cool air in relatively cooler "cold aisles" as needed and discharge warm server exhaust into contained hot aisles that are relatively hotter. The warm server exhaust may be returned to a cooling unit as return air for cooling and recirculation in cool air streams in the cold aisles. This design may be more efficient and effective when air velocities are low and mixing of the cool air and warm exhaust is decreased. The cooling system may be, for example, a horizontal, top-down, or up-flow cooling system or any other suitable cooling system including cold aisles and hot aisles.

Temperatures in the hot aisle may, in some examples, reach 90-100 degrees Fahrenheit or more. For persons needing to service, repair, or otherwise access equipment via the hot aisle, these temperatures can be undesirable or may not comply with certain work environment safety requirements. The cooling device described herein may provide a cost-effective and efficient approach to provide localized cooling in the area of the hot aisle where a person is working or any other area desired to be cooled, and to automatically stop the flow of cool air into the hot aisle when no longer needed. The cooling device described herein may avoid the need to open a door or other opening between the cold aisle and the hot aisle to allow cool air to escape from the cool air to the hot aisle and thus cool the hot aisle, which may be inefficient and may violate fire codes. The cooling device described herein may provide localized cooling in a specific location where the person is working, without unnecessarily cooling large spaces of the hot aisle including spaces not occupied by the person working in the hot aisle. The cooling device is movable so that it may be moved with the worker to different areas of the hot aisle. In some examples, the cooling device described herein may include an automatic shut-off function (e.g., a timer) that may further avoid situations in which a door or opening is accidentally left open longer than needed, such as a user forgetting to close the door or opening upon exiting the hot aisle, and thus the cooling device may avoid unnecessary or excessive flow of cool air into the hot aisle.

Figure 1A:
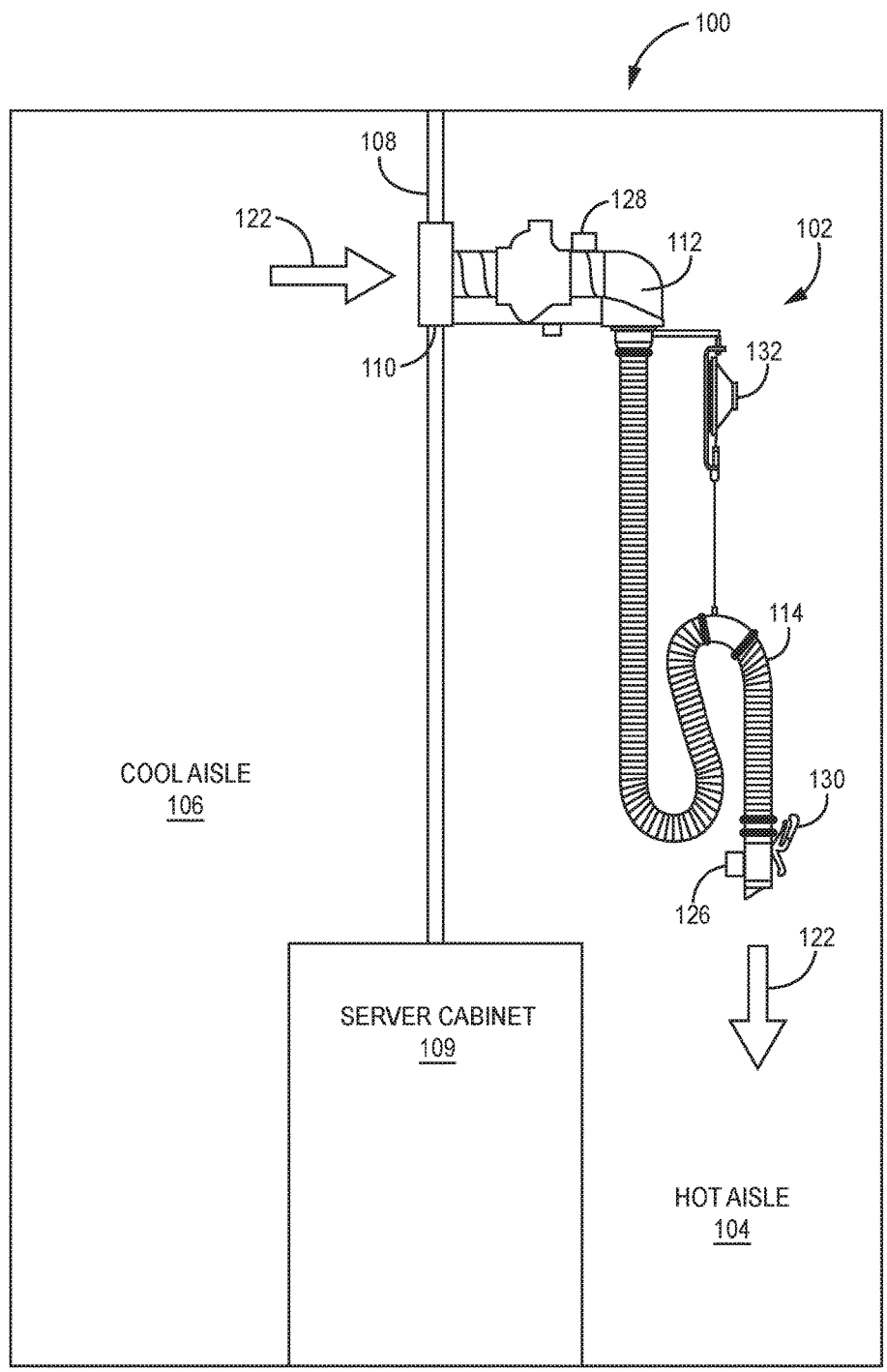
FIG. 1A illustrates a side view of a portion of a data center storage space including a cooling device, in accordance with one or more techniques of the disclosure.
Figure 1B:
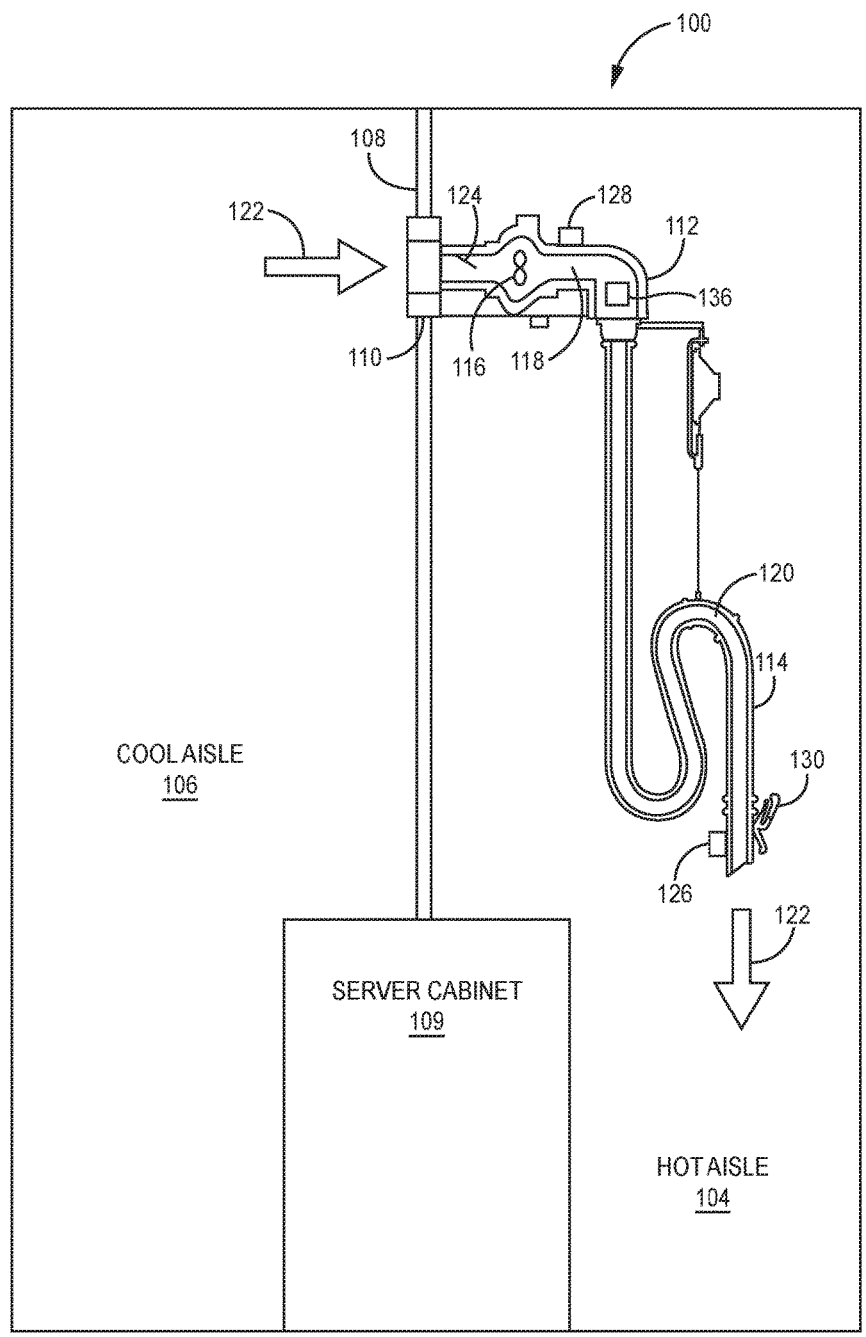
FIG. 1B illustrates a side cross-sectional view of the portion of the data center storage space of FIG. 1A, in accordance with one or more techniques of the disclosure.

FIG. 1A illustrates a side view of a portion of a data center storage space 100 including a cooling device 102, in accordance with one or more techniques of the disclosure. FIG. 1B illustrates a side cross-sectional view of the portion of the data center storage space 100 of FIG. 1A. The data center storage space 100 may include a hot aisle 104, a cold aisle 106, and a partition 108 separating the hot aisle 104 from the cold aisle 106.

The hot aisle 104 may be configured to collect hot air generated by equipment housed in the data center storage space 100, such as servers stored in one or more server cabinets 109, and the cold aisle 106 may be contained such that it is isolated from the hot air collected in the hot aisle 104. A temperature of air disposed in hot aisle 104 is greater than a temperature of air disposed in cold aisle 106. In some examples, a ceiling, other partitions, walls, devices and/or cabinets may combine with the partition 108 and server cabinets 109 to contain one or more of the hot aisle 104 and the cold aisle 106. In some examples, hot aisle 104 may be enclosed to collect the hot exhaust air produced by the equipment, and cold aisle 106 may be open to the rest of data center storage space 100, and may not be enclosed or contained in the same way as hot aisle 104. Servers and/or other equipment may be arranged in rows within server cabinets 109, and may be oriented such that exhaust fans from the servers or other equipment each face the hot aisle 104. Exhaust from the servers and/or other equipment is released into the hot aisle 104. In some examples, the exhaust may be collected from the hot aisle 104 and directed via an exhaust or return air space to one or more cooling units as return air. The cooling units cool the air from the hot aisle 104, and the cooled air is recirculated into the cold aisle 106 to cool the servers and/or other equipment. In addition or alternatively, other air, such as outdoor air taken from outside of data center 100, may be cooled and/or released into the cold aisles 106 to cool the servers and/or other equipment.

The partition 108 may be made of metal, plastic, glass, or other material or combination of materials. The partition 108 may define an aperture 110. The cooling device 102 may include a connection member 112, a flexible member 114, and a fan 116. In other examples, the cooling device may not include a fan and air may be moved from the cold aisle 106 to the hot aisle 104 through the cooling device due to a pressure difference between the hot and cold aisles.

The connection member 112 may be configured to connect to the aperture 110 and may define lumen 118. The connection member 112 may include any suitable components to allow connection member 112 to connect to aperture 110 and may be configured to easily attach to and detach from the aperture 110. For example, connection member 112 may include outer threads configured to mate with inner threads of the aperture 100 such that connection member 112 may be rotated into aperture 110. As another example, a keyed joint arrangement may allow the connection member 112 to be placed within aperture 110 and rotated to lock the connection member 112 in place. Any other suitable components may be included according to particular needs.

The flexible member 114 may be connected to the connection member 112 and may define a lumen 120. Although illustrated as being two separate components, in some examples, the connection member 112 and the flexible member 114 may be integrally formed as a single component.

Cold air 122 moves from the cool aisle 104, through the cooling device 102 (through aperture 110, through lumen 118, and then through lumen 120), and out into the hot aisle 106. In some examples, the cold air 122 may be moved through the cooling device 102 by a fan 116. Alternatively or in addition, the cold air 122 may be moved through the cooling device 102 by a pressure difference between the cold aisle 104 and the hot aisle 106.

At least a portion of the flexible member 114 may be configured to be selectively movable. For example, the flexible member may comprise corrugated plastic, fabric and a wire helix, tubing, jointed tubing, hose, or any other suitable material that may allow the flexible member to be flexible and thus moveable according to particular needs. In certain examples, the flexible member 114 may be comprised of a material configured to hold its shape upon positioning by a user. For example, the flexible member 114 may comprise fabric reinforced with a wire helix such that a user may position the flexible member 114 by bending the wire helix and upon release by the user, the flexible member 114 may substantially hold the desired position. The flexible member 114 may have any suitable dimensions according to particular needs. For example, the flexible member 114 may have a length sufficient to allow a user to position the flexible member 114 to positions within the hot aisle 104 as needed and may be of a width sufficient to allow for targeted delivery of cool air through the lumen 120 of flexible member 114. In some examples, flexible member 114 may be formed of materials that allow flexible member 114 to stretch to increase the length of flexible member 114 and retract to decrease the length of flexible member 114. In some examples, flexible member 114 may include portions that provide a telescoping function to increase or decrease in length.

The fan 116 may be configured to move cool air 122 from the cold aisle 106 to the hot aisle 104. At least a portion of the fan 116 may be positioned within the lumen 118 or the lumen 120. For example, in the illustrated example, fan 116 is shown positioned within the lumen 118. The fan 116 may be any suitable type of fan. For example, the fan 116 may be centrifugal, axial, cross flow, or any other suitable type of fan.

In some examples, a valve 124 may be configured to move between an open position, as shown, to allow air flow through the device 102 and a closed position to obstruct air flow through the device 102. In the illustrated example, cooling device 102 includes the valve 124. In other examples, the partition 108 may include the valve 124. For example, the valve 124 may be positioned within the aperture 110 and may be configured to open and close to respectively open and close the aperture 110. The valve 124 may be any suitable type of valve. For example, the valve 124 may be a backdraft damper, a ball valve, a check valve, a gate valve, or any other particular type of valve may be used, according to particular needs.

In some example, an actuator 126 may be configured to, upon actuation, turn on the fan 116 and/or move the valve 124 from the closed position to the open position. In some examples, the actuator 126 may be further configured to upon actuation, turn off the fan 116 and/or move the valve 124 from the open position to the closed position. The actuator 126 may be in the form of a button, a switch, or any other suitable form for allowing a user to indicate intent to turn on or off the fan 116, move the valve 124, or any other action, according to particular needs.

Although shown as being located on the flexible member 114 of the device 102, the actuator 126 may be located in any suitable location. For example, the actuator 126 may be located on a remote control that is separate from the cooling device 102 and configured to communicate with one or more components of the cooling device 102 via a wired or wireless connection, or may be located in any other suitable location according to particular needs. In some examples, the system may include multiple actuators in multiple locations and each actuator may be configured for initiating single or multiple actions.

In some examples, a timer 128 may be configured to turn off the fan 116 after a predetermined time period following an actuation of the actuator 126 resulting on turning on the fan 116 and/or may be configured to move the valve 124 from the open position to the closed position after a predetermined time period following the actuation of the actuator 126 resulting in opening the valve 124. The time periods for turning off the fan 116 and/or closing the valve 124 may be different or may be equal, according to particular needs. Although one timer 128 is illustrated, multiple timers may be included. For example, one timer may be used to turn off the fan 116 and another timer may be used to close the valve 124.

In some examples, a positioning member 130 may be attached to the flexible member 114 and may be configured to removably attach at least a portion of the flexible member 114 to a server cabinet 109 or to any other suitable component to secure the flexible member 114 in place as desired. For example, the positioning member 130 may include one or more of a magnet or a clamp that may allow a user to position the flexible member 114 on the server cabinet 109 such that cool air 122 may be directed out of the flexible member 114 to a desired location, such as a location in the hot aisle 104 where the user is working. Positioning of the flexible member 114 will be described in further detail below with reference to FIG. 4.

In some examples, a retractable member 132 may be attached to the flexible member 114 and may be configured to extend to allow the flexible member 114 to be positioned as desired within the hot aisle 104 when in use and may be configured to retract to keep the flexible member 114 compact and out of the way when the flexible member 114 is not in use. For example, in some examples, retractable member 132 may include a retractable cable on a spring retractor. The retractable member 132 may extend to any suitable length. For example, the retractable member 132 may include a cable with a length of approximately fifteen feet. In some examples, the retractable member 132 may include a cable with a length of approximately 10-25 feet or any other suitable length according to particular needs.

In some examples, the cooling device 102 may further include an auxiliary cooling system 136 to provide additional cooling to the cold air 122. In some examples, at least a portion of the auxiliary cooling system 136 may be positioned with the lumen 118 and may be configured to cool cold air 122 traveling through cooling device 102. In some examples, at least a portion of the auxiliary cooling system 136 may be positioned outside of the lumen 118 and otherwise in a path of the cold air 122. In some examples, the auxiliary cooling system 136 may be an evaporative cooling system and may comprise a wicking media to which cool water may be supplied and evaporated into the cold air 122 as it passes over the wicking media to cool and humidity the cold air 122 as it passes from the cold aisle 106 to the hot aisle 104. In some examples, the auxiliary cooling system 136 may be a direct expansion system and may comprise a direct expansion cooling coil configured to cool the cold air 122 as it passes from the cold aisle 106 to the hot aisle 104.

In some examples, the auxiliary cooling system 136 may be a device that may be hooked up to a water or refrigerant supply within the data center. In some examples, the auxiliary cooling system 136 may include a storage container for water and/or refrigerant such that the auxiliary cooling system 136 may function without being hooked up to a water or refrigerant source. In this example, the storage container may need to be refilled when the water and/or refrigerant within the storage container is used up. In some examples, heat produced by the auxiliary system 136 may be expelled away from the area being cooled including, for example, to an exhaust space for recirculation through the data center, to another portion of the hot aisle, and/or to a space outside of the data center. In some examples, the auxiliary system 136 described herein may be included in cooling device 102 instead of fan 116 in examples described above.

Although shown as being used in conjunction with the cooling device 102, in some examples, the auxiliary system 136 may be used independently from or instead of the cooling device 102. In some examples, an auxiliary cooling system may be a separate system from cooling device 102 and may be used to cool air within the hot aisle 104, and to direct the cooled air into a particular portion of the hot aisle, as desired. For example, in some examples an auxiliary system may not transfer air from cold aisle 106 to hot aisle 104, but rather may cool air already present in hot aisle 104, and can be selectively positioned to direct the cooled air to desired locations within hot aisle 104. In these examples, the auxiliary cooling system may be a direct expansion system, an evaporative cooling system, or a device that may be hooked up to a water or refrigerant supply.

Figure 2:
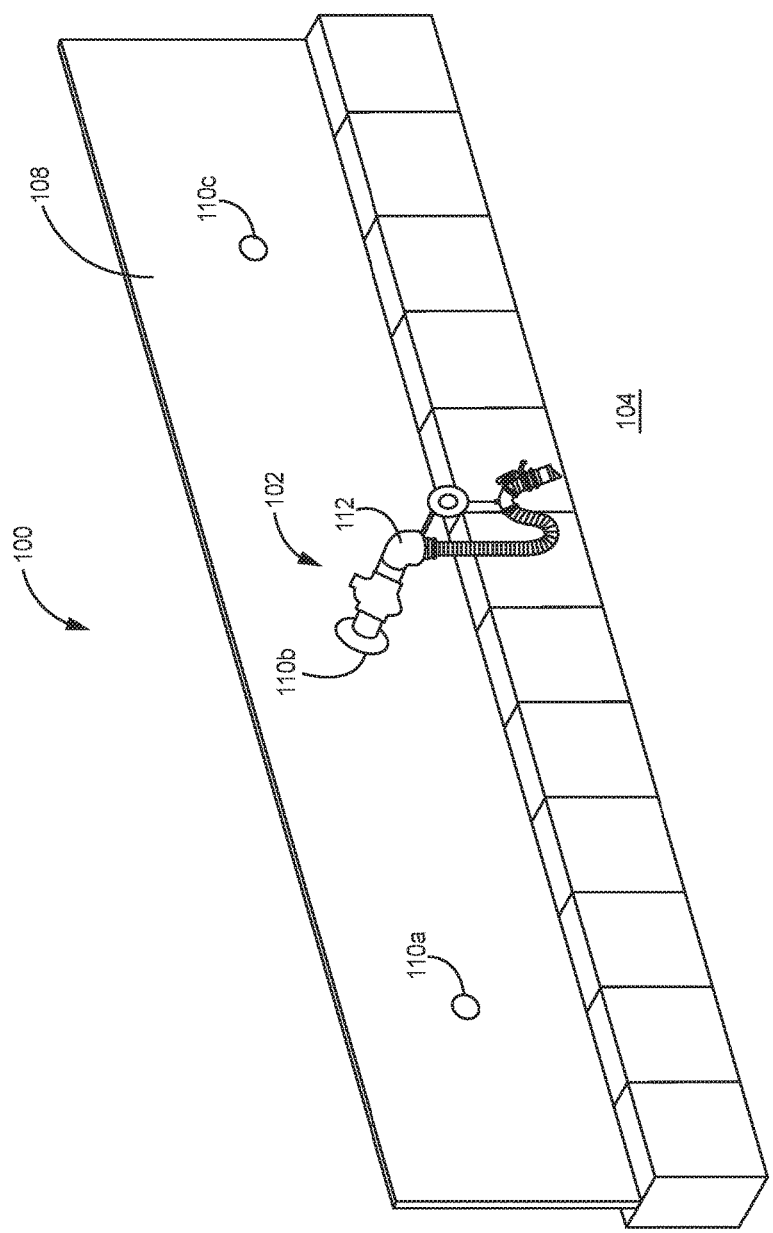
FIG. 2 is a perspective view the of the data center storage space of FIGS. 1A and 2B, in accordance with one or more techniques of the disclosure.

FIG. 2 is a perspective view the of the data center storage space 100 of FIGS. 1A and 1B, in accordance with one or more techniques of the disclosure. The partition 108 of the data center storage space 100 may define a plurality of apertures 110a, 110b, and 110c (collectively "apertures 110"). While connection member 112 of cooling device 102 is shown as being connected to aperture 110b, connection member 112 may be configured to removably connect to any of the plurality of apertures 110. For example, if a user needs to work in any area of the hot aisle near aperture 110a, the user may remove the cooling device 102 from the aperture 110b and attach it to the aperture 110a. As another example, if a user needs to work in any area of the hot aisle near aperture 110c, the user may attach the cooling device 102 to the aperture 110c. As another example, if cooling device is not in use or is needed for use in another hot aisle, the cooling device 102 may removed from aperture 110b and not connected to any of the apertures 110a, 110b, or 110c.

In some examples, the partition 108 may initially be installed having apertures 110. The apertures 110 may be capped or sealed with caps when no cooling unit 102 is installed. In some examples, the cooling unit 102 may be installed at a particular aperture, such as aperture 110b, after a tenant has purchased server space on a server near the aperture 110b or after the cooling unit 102 has been requested by the tenant. In this way, a cooling unit 102 may be installed at the aperture 110b when needed, potentially limiting data center infrastructure costs.

Each of apertures 110a, 110b, and 110c may be configured to be closed when the cooling device 102 is not attached to the respective aperture 110a, 110b, or 110c. For example, each of the apertures 110 may include a cap, valve, or other device configured to close the respective aperture 110a, 110b, or 110c. A cap may be configured to fit over or within the respective aperture 110a, 110b, or 110c and snap, screw, or otherwise attach to a portion of the partition in or near the respective aperture 110a, 110b, or 110c to close off the respective aperture 110a, 110b, or 110c when not in use and may be configured to be easily removed or displaced when a user desires to attach and/or use the cooling device 102 at the respective aperture 110a, 110b, or 110c.

In some examples, a valve may be configured to fit over or within the respective aperture 110a, 110b, or 110c and to close when the respective aperture 110a, 110b, or 110c is not in use and open when a user desires to use the cooling device 102 at the respective aperture 110a, 110b, or 110c. Any suitable type of valve may be used. For example, a backdraft damper, a ball valve, a check valve, a gate valve, or any other particular type of valve may be used, according to particular needs.

Although illustrated as defining three apertures 110a, 110b, and 110c, the partition 108 may define any suitable number of apertures 110. For example, depending on the length of the partition 108 and the allowable distance that the flexible member 114 can be extended, any suitable number of apertures 110 may be defined by the partition such that users may comfortably use the cooling device 102 at any suitable position within the hot aisle, according to particular needs.

Figure 3:
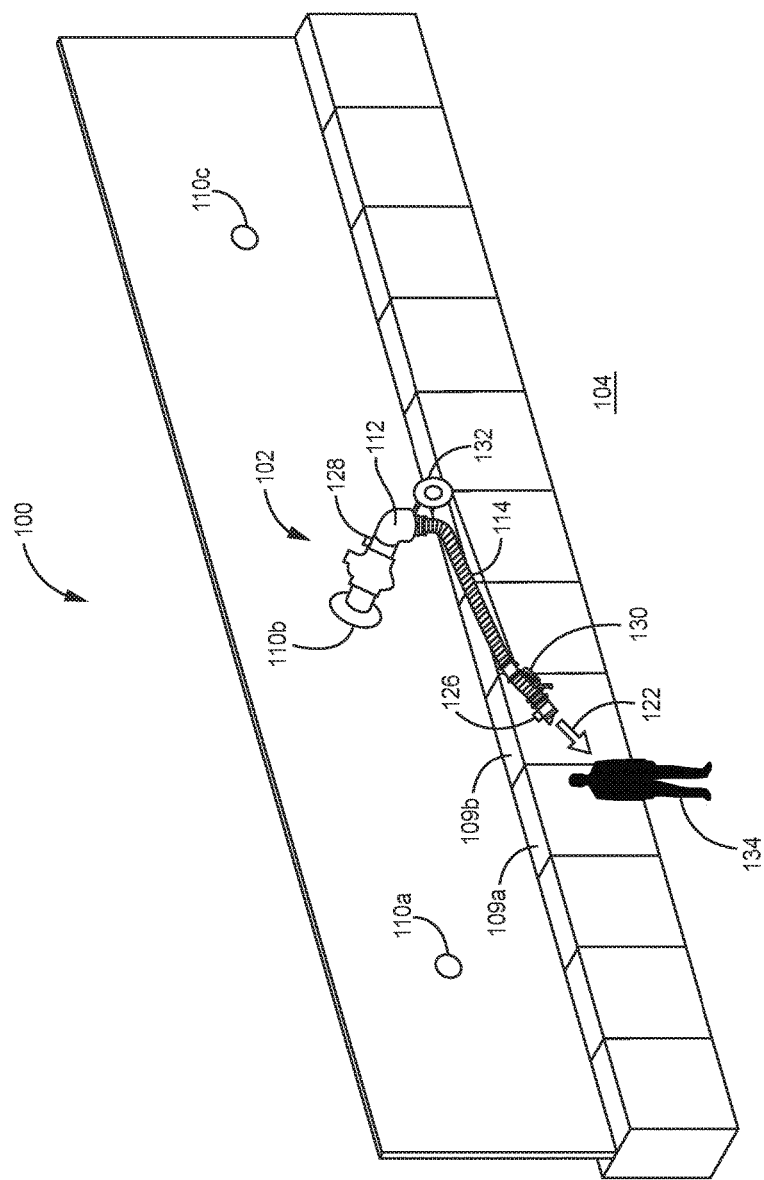
FIG. 3 is a perspective view the of the data center storage space of FIGS. 1A and 2B with the cooling device positioned and in use by a person in the hot aisle, in accordance with one or more techniques of the disclosure.

FIG. 3 is a perspective view the of the data center storage space 100 of FIGS. 1A and 1B with the cooling device 102 positioned and in use by a person in the hot aisle, in accordance with one or more techniques of the disclosure.

A user 134 may be working in the hot aisle 104. For example, the user 134 may need to access server cabinet 109a to repair or otherwise service components within the server cabinet 109a. The user 134 may use cooling device 102 to cool the area where user 134 will be working so that the area is at a more comfortable temperature than the rest of the hot aisle 104. In some examples, the user 134 or another person may attach the cooling device 102 to the aperture 110b, which may be the aperture closest to the server cabinet 109a or otherwise the aperture that is most convenient. In some examples, a cap may be removed from aperture 110b in order to attach the cooling device 102 to the aperture 110b. In some examples, a valve may be opened in order to allow the cooling device 102 to be used at the aperture 110b.

The user 134 may position the cooling flexible member 114 to direct the air flow from the cooling device to the desired area near server cabinet 109a. In some examples, the user 134 may extend retractable member 134 and flexible member 114 as desired to reach or be near the desired location. In some examples, the user 134 may use positioning member 130 to removably attach flexible member 114 to the server cabinet 109b and secure the flexible member 114 in place such that air will be directed to a desired area where the user 134 will be working. For example, positioning member 130 may be a clamp and the user 134 may clamp the positioning member 130 onto the server cabinet 109b. In other examples, the positioning member 130 may be a magnet and the user 134 may attach the positioning member 130 to a metal surface on the server cabinet 109b. The positioning member 130 may include any suitable components for attaching the flexible member 114 to the server cabinet 109b.

In some examples, the user 134 may press or otherwise actuate actuator 126 to turn on the fan 116 and/or move the valve 124 from the closed position to the open position such that cool air 122 may move from the cold aisle 106 to the hot aisle 104 through the cooling device 102 and the cool air 122 is directed in the desired area, thus cooling the area to make the temperature more comfortable for the user 134. In some examples, the user 134 may decide, after the fan 116 is on, that the cool air 122 escaping from the flexible member 114 is not directed as desired and may reposition the flexible member 114 to redirect the cool air 122 as desired.

In some examples, a timer 128 may be configured to turn off the fan 116 and/or shut the valve 124 after a predetermined amount of time after actuation of the actuator 126. For example, a timer 128 may turn off the fan 116 and/or shut the valve 124 approximately ten minutes after the actuator 126 was actuated to turn on the fan 116 and/or open the valve 124. As another example, the timer 128 may turn off the fan 116 and/or close the valve 124 approximately 5-30 minutes after the actuator 126 is actuated to turn on the fan 116 and/or open the valve 124, or after any particular time period according to particular needs.

As an additional example, a motion sensor may be used to sense motion near the cooling device 102 and to automatically turn off the fan 116 and/or close the valve 124 after motion is no longer detected for a predetermined time period. For example, if no motion is detected by the motion detector for five minutes, the device may be configured to automatically turn off the fan 116 and/or close the valve 124 until motion is again detected or until a user again actuates the actuator 126.

The user 134 may actuate the actuator 126 to turn on the fan 116 and/or open the valve 124, such that cool air 122 is moved through the cooling device 102 and into the desired area where the user 134 is working. The user 134 may work in the hot aisle 104 while the desired area is being cooled. After the user 134 works in the area for some time, the timer 128 may turn off the fan 116 and/or close the valve 124, such that cool air 122 is stopped from moving through the cooling device 102. If the user 134 is planning to continue to work in the hot aisle 104 for some time, the user 134 may decide to actuate the actuator 126 again to once again to turn on the fan 116 and/or open the valve 124, such that cool air 122 is moved through the cooling device 102 and into the desired area where the user 134 is working. The user 134 may continue to do this until the user 134 is done working in the hot aisle 104 or otherwise no longer requires cool air 122 to be moved into the hot aisle 104.

In some examples, a user 134 may also be able to actuate the actuator 126 or a different actuator to turn off the fan 116 and/or close the valve 124, such that cool air 122 is stopped from moving through the cooling device 102. For example, when the user 134 is done working in the hot aisle 104 or otherwise no longer requires cool air 122 to be moved into the hot aisle 104, the user 134 may be able to actuate the actuator 126 or a different actuator to turn off the fan 116 and/or close the valve 124, such that cool air 122 is stopped from moving through the cooling device 102.

Although one actuator 126 is illustrated, different actuators may be used by the user 134 for different functions. For example, different actuators may be used for turning on the fan 116, opening the valve, turning off the fan 116, and/or closing the valve 124.

In some examples, the actuator 126 or any other actuator or actuators may be on a remote control such that the user 134 may easily control components of the cooling device 102 from any suitable location even when the user 134 is not close to the cooling device 102.

The foregoing examples have several advantages including allowing for targeted cooling of a desired portion of a hot aisle by movement of cool air from a cold aisle to the hot aisle, allowing for cooling of that portion to be more effective and/or efficient. The foregoing examples may also allow for the cooling to automatically stop after a preset time period, preventing the risk of a user accidentally allowing for air to escape from the cold aisle to the hot aisle for long periods when no longer needed, thereby avoiding inefficiency in cooling of the hot aisle.

Although the foregoing examples have been illustrated as being used to move cool air from a cold aisle to a hot aisle in a data center, the cooling device 102 can be used in a variety of different applications requiring release of a cool fluid from a volume containing the cool fluid to a volume containing a hot fluid. For example, the cooling device may be used by a user who is outdoors on a hot day and is located outside of an air-conditioned building and would like to direct cool air from within the building to a desired area outside of the building to, for example, make the user more comfortable. As a further example, the cooling device may be used in an IT facility other than a data center. As another example, the cooling device may be used in a manufacturing facility to temporarily cool a hot area of the manufacturing facility in which a user is working.

Various examples have been described. These and other examples are within the scope of the following claims.

What is claimed is:

1. A system comprising:
    a data center storage space comprising a hot aisle and a cold aisle;
    a partition separating the hot aisle and the cold aisle, the partition defining an aperture;
    a cooling device comprising:
        a connection member configured to connect to the aperture, the connection member defining a first lumen; and
        a flexible member connected to the connection member and defining a second lumen, wherein at least a portion of the flexible member is configured to be selectively movable,
        wherein the cooling device is configured to allow cool air to move from the cold aisle to the hot aisle to lower a temperature of air disposed within the hot aisle; and
    a valve configured to move between an open position to allow air flow through the cooling device and a closed position to obstruct air flow through the cooling device, wherein the valve is positioned within at least one of the partition and the first lumen.

2. The system of claim 1, wherein the cooling device is configured such that a pressure difference between the hot aisle and the cold aisle causes cool air to be moved from the cold aisle to the hot aisle to lower a temperature of air disposed within the hot aisle.

3. The system of claim 1, wherein the aperture is one of a plurality of apertures defined by the partition, and wherein the connection member is configured to removably connect to any of the plurality of apertures.

4. The system of claim 1, wherein the hot aisle is configured to collect hot air generated by equipment housed in the data center storage space, wherein the cold aisle is isolated from the hot air collected in the hot aisle.

5. The system of claim 1, wherein the connection member and the flexible member are integrally formed.

6. The system of claim 1, further comprising an actuator configured to, upon actuation, move the valve from the closed position to the open position.

7. The system of claim 6, further comprising a timer configured to move the valve from the open position to the closed position after a second time period following the actuation of the actuator.

8. The system of claim 1, further comprising a positioning member attached to the flexible member, the positioning member configured to removably attach at least a portion of the flexible member to multiple different positions of a server cabinet.

9. The system of claim 8, wherein the positioning member comprises one or more of:
    a magnet; and
    a clamp.

10. The system of claim 1, wherein the cooling device further comprises a fan configured to move cool air from the cold aisle to the hot aisle to lower a temperature of air disposed within the hot aisle, at least a portion of the fan being positioned within the first lumen or the second lumen.

11. The system of claim 10, further comprising an actuator configured to turn on the fan.

12. The system of claim 11, further comprising a timer configured to turn off the fan after a first time period following an actuation of the actuator.

13. An assembly comprising:
    a partition configured for placement between a hot aisle and a cold aisle of a data center, the partition defining an aperture;
    a cooling device comprising:
        a connection member configured to connect to the aperture, the connection member defining a first lumen; and
        a flexible member connected to the connection member and defining a second lumen, wherein at least a portion of the flexible member is configured to be selectively movable; and
    a valve configured to move between an open position to allow air flow through the cooling device and a closed position to obstruct air flow through the cooling device, wherein the valve is positioned within at least one of the partition and the first lumen.

14. The assembly of claim 13, wherein the aperture is one of a plurality of apertures defined by the partition and the connection member is configured to removably connect to each of the plurality of apertures.

15. The assembly of claim 13, wherein the cooling device further comprises a fan configured to move cool air from the cold aisle to the hot aisle to lower a temperature of air disposed within the hot aisle, at least a portion of the fan being positioned within the first lumen or the second lumen.

16. The assembly of claim 15, further comprising an actuator configured to turn on the fan.

17. The assembly of claim 16, further comprising a timer configured to turn off the fan after a first time period following an actuation of the actuator.

18. A cooling device comprising:
- a connection member configured to connect to an aperture defined by a partition between a hot aisle and a cold aisle of a data center, the connection member defining a first lumen;
- a flexible member connected to the connection member and defining a second lumen, wherein at least a portion of the flexible member is configured to be selectively movable;
- a fan configured to move cool air from the cold aisle to the hot aisle to lower a temperature of air disposed within the hot aisle, at least a portion of the fan being positioned within the first lumen or the second lumen; and
- a valve configured to move between an open position to allow air flow through the cooling device and a closed position to obstruct air flow through the cooling device, wherein the valve is positioned within the first lumen.

19. The cooling device of claim 18, wherein the connection member and the flexible member are integrally formed.

20. The cooling device of claim 18, further comprising an actuator configured to, upon actuation, do one or more of:
turn on the fan; or
move the valve from the closed position to the open position.

\* \* \* \* \*